SPACE CHARGE WAVE AMPLIFIERS USING CATHODE DROP TECHNIQUES

Filed July 15, 1968 2 Sheets-Sheet 1

INVENTOR
JOHN B. GUNN

BY S. P. Tedesco

ATTORNEY

Nov. 17, 1970 J. B. GUNN 3,541,401

SPACE CHARGE WAVE AMPLIFIERS USING CATHODE DROP TECHNIQUES

Filed July 15, 1968 2 Sheets-Sheet 2

United States Patent Office 3,541,401

Patented Nov. 17, 1970

3,541,401

SPACE CHARGE WAVE AMPLIFIERS USING CATHODE DROP TECHNIQUES

John B. Gunn, Mount Kisco, N.Y., assignor to International Business Machines Corporation, Armonk, N.Y., a corporation of New York

Filed July 15, 1968, Ser. No. 745,008
Int. Cl. H01l *9/00*
U.S. Cl. 317—234 18 Claims

ABSTRACT OF THE DISCLOSURE

A space charge wave amplifier comprises a semiconductor body having a multivalley conduction band system and wherein conduction carriers exhibit a differential negative mobility when the intensity of applied electric fields exceeds a critical value $E_T$. When the semiconductor is formed on n-type material, the ratio of current density J to net ionized impurity density N, i.e., *J/N*, of that region of the semiconductor body adjacent the cathode contact is greater than the *J/N* ratio of the remaining, or active, region of the semiconductor body. Such ratios can be determined by reducing the cross-sectional area, increasing the resistivity, etc., of the cathode region with respect to the active region of the semiconductor body. When a voltage of sufficient magnitude is applied across the semiconductor body, the result is a stationary region of electric fields greater than the critical value $E_T$ which extends beyond the boundary of the cathode region and into the active region of the semiconductor body. The extension of such stationary region of electric fields, or the cathode drop region, is a function of the applied voltage and, also, the geometry and/or structure of the cathode region. A perturbation of electirc field within the cathode drop region gives rise to a traveling space charge wave which grows exponentially along the cathode drop region. Various arrangements are described to initiate such space charge region along the cathode drop region and for coupling to an external load.

BACKGROUND OF THE INVENTION

This invention relates to a solid-state amplifier and, more particularly, to space charge wave amplifiers utilizing the cathode drop which occurs in particular semiconductor specimens. A cathode drop can be defined as a stationary high field region associated with a portion of the semiconductor specimen exhibiting a local maximum of *J/N* and wherein electric fields are of sufficient intensity to give the conduction carrier a negative differential mobility.

With advances in the solid-state technology, new and radically different devices are being introduced. Such devices, although of microminiature size, exhibit good operating characteristics compared with the more cumbersome prior art devices. For example, bulk-effect solid state oscillators have attracted widespread attention due to their small size and low cost as compared to previously available microwave oscillators, e.g. klystrons, magnetrons, etc. Such bulk-effect oscillators have been described in the J. B. Gunn Pat. No. 3,365,583, issued on Jan. 23, 1968. Essentially, bulk-effect oscillators comprise a small specimen of a particular semiconductor material having a multivalley conduction band system, e.g. GaAs, InP, etc., such material having the inherent property of generating coherent current oscillations in the microwave range when subjected to electric fields in excess of a critical, or threshold, intensity $E_T$. According to present theory, a high electric field region, or domain, forms within the specimen in response to electric fields in excess of the critical threshold $E_T$ due to a redistribution of electric fields within the specimen. This redistribution of electric fields results from a transfer of conduction carriers from a high-mobility to a low-mobility conduction band under the influence of the applied electric fields, the result being to reduce the conductance of the specimen. A domain, when nucleated, can be sustained and propagated along the semiconductor specimen under the influence of electric fields greater than a sustaining intensity $E_S$, where $E_T > E_S$. When a constant voltage of sufficient intensity is applied across the specimen, domains can be cyclically nucleated and propagated whereby current flow along the specimen is modulated in the form of coherent sustained oscillations. The mechanism by which domains are nucleated has been more fully described in "Theory of Negative-Conductance Amplification and of Gunn Instabilities in 'Two-Valley' Semiconductor," by D. E. McCumber et al., IEEE Transactions of Electron Devices, vol. ED–13, No. 1, January 1966.

The domain in prior art bulk-effect oscillators can be considered as a traveling space charge region of very small width and having an electric field intensity in excess of the threshold intensity $E_T$ and containing low-mobility charge carriers. In such bulk-effect devices, the presence and absence only of a domain within the semiconductor specimen was advantageously employed to modulate current flow, either cyclically or on a one-shot basis. Accordingly, while oscillators, triggers, logical arrangements, etc. could be achieved, the bulk properties of semiconductor materials have not been fully exploited. The dimensions of the domain, or high field region, were sufficiently small as not to be of practical utilization. Also, only very limited control over domain width was available, e.g. by varying the applied voltage. Such fact was further complicated in that the high electric field region could not be made stationary. If the high electric field region could be made stationary and its length controlled, the negative differential mobility of the conduction carriers in such region could be utilized to practical advantage, for example, to effect amplification. Localization of the high electric field region along the semiconductor specimen as well as the ability to control its width would provide a new class of space charge wave amplifiers which are of simple and inexpensive construction. In such event, the negative differential mobility of conduction carriers in the localized high electric field regions could be utilized to support growing space charge waves to achieve amplification.

Accordingly, an object of this invention is to provide a novel space charge wave amplifier.

Another object of the invention is to provide a localized high electric field region in a semiconductor specimen of controlled length wherein the conduction carriers exhibit a negative differential mobility.

Another object of this invention is to provide a stationary high electric field region in a semiconductor specimen of sufficient intensity to support a growing space charge wave.

Another object of this invention is to provide a space charge wave amplifier having a controlled gain.

Another object is to provide a solid-state device having a stationary high electric field region and structure for coupling signals into and out of such region, to obtain space charge wave amplification.

SUMMARY OF THE INVENTION

These and other objects and features of the invention are achieved by determining the geometry and/or structure of the semiconductor specimen such that, for a given applied voltage thereacross, an extended cathode drop region results, input and output terminals being coupled separately at different points to initiate and sense a growing space charge wave along such region. The semiconductor specimen is characterized as one wherein charge carriers exhibit a negative differential mobility when the intensity of applied electric fields exceeds a critical value $E_T$. The gain of the amplifier is limited so that the space charge wave is not allowed to grow to an amplitude to introduce nonlinearities which modulate the current and augment the space charge wave such that the amplifier becomes unstable.

The intensity of electric fields within a semiconductive specimen as a function of the $J/N$ ratio (current density/ionized impurity density) is given by the expression:

$$\frac{Kv(E)}{4\pi eN}\frac{dE}{dx}=J/eN-v(E)$$

where

E is the electric field intensity,
$e$ is the carrier charge,
N is the impurity density,
$x$ is the distance in the direction of current flow,
K is the dielectric constant,
J is the current density,
$v$(E) is the carrier velocity as a function of the electric field intensity E.

In accordance with the invention, when a given current is passed through the semiconductor specimen, the $J/N$ ratios (current density/ionized impurity density) of particular regions of the semiconductive body are determined such that the ratio in the region adjacent the cathode contact, or cathode region is higher than that of the remaining, or active, region. Such ratios can be determined by reducing the cross-sectional area, increasing the resistivity, etc. of the cathode region. Accordingly, when an increasing current is passed through the semiconductor specimen, the electric field intensity exceeds the threshold intensity $E_T$ first in the cathode region; at this time, the carrier velocity in the cathode region decreases and becomes insufficient to support the current flowing. Accordingly, additional majority carriers are injected from the cathode contact into the cathode region and produces a negative space charge therein. Consequently, the electric field in the cathode region increases with distance from the cathode contact. When the intensity of the electric field increases above the threshold intensity $E_T$ at the boundary between the cathode region and remaining region of the semiconductor body, the cathode drop region begins to form and, for increasing values of current, extends into the active region of the semiconductor body. The electric field intensity in such active region reaches a limiting value in excess of $E_T$, which is determined by the $J/N$ ratios and the dimensions of the various regions. The geometry and/or structure of the semiconductor body is such as to insure that the electric field intensity $E_0$ at the boundary between the cathode region and the active region is greater than the threshold field $E_T$. The result is a region of electric field greater than $E_T$ which extends beyond the boundary into the remaining portion of the body. The length of the high electric field region, or cathode drop region, is dependent upon the structure and/or geometry of the cathode region and the magnitude of the current; more particularly, the length of the cathode drop region is determined by how closely the velocity of carriers passing through the boundary and into the remaining portions of the semiconductor body approaches that value which would be required to support the current in the absence of space charge. Accordingly, when the cathode drop region is localized, the distance available for the growth of space charge waves is limited and domains are not propagated in the cathode drop region. In the remainder of the semiconductive body, the electric field is then too small to permit domains to propagate. Even when the cathode drop extends throughout the active region, the presence of the cathode region, with its higher value at $J/N$, appears to exert a stabilizing influence against domain formation.

The $J/N$ ratios of the cathode region and the active region can be determined by controlling the current density, by varying the cross-sectional area and/or by varying in the ionized donor density in the respective regions. In accordance with one embodiment, the cross-sectional area of the cathode region is reduced to increase current density J relative to that in the remainder of the body; also, the cathode contact can be subdivided, the subdivided portions being connected in parallel whereby the aggregate area of the cathode contact is less than the cross-sectional area of the semiconductor body immediately adjacent thereto. In an alternative embodiment, the doping density N in the cathode region is reduced relative to that in the remainder of the body. It is evident that numerous other techniques can be utilized to provide the requisite $J/N$ ratios of the district regions of the semiconductive body.

A negative differential mobility of the charge carriers can permit the amplification of waves of space charge propagating on the carrier stream. Accordingly, a perturbation of the electric field in the cathode drop region gives rise to a traveling space charge wave which grows expotentially along the cathode drop region. For example, a small perturbation travels with the velocity of the carriers, and varies with distance approximately proportionately to the expression $$\exp\left(-\frac{4\pi Nedv/dE}{kv}x\right)$$

Various arrangements are hereinafter described for exciting an RF electric field component in the direction of current flow along the semiconductive body to initiate such growing space charge wave and for coupling from such space charge wave to an external load. Space charge wave amplifiers of the type hereinafter described should exhibit an upper frequency limit in excess of $10^{10}$ Hz. and power gain.

The foregoing and other objects, features and advantages of the invention will be apparent from the following more particular description of preferred embodiments of the invention, as illustrated in the accompanying drawings.

DESCRIPTION OF THE INVENTION

Figure 1B:
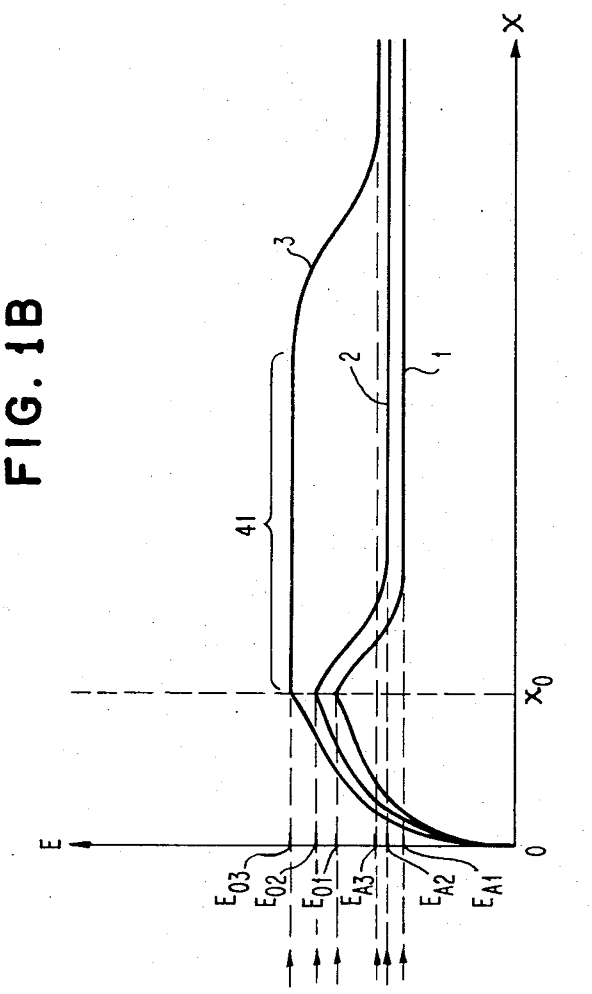
FIG. 1A illustrates the conduction carrier velocity versus electric field curve and FIG. 1B illustrates the electric field distribution when a voltage is applied across the semiconductive body.

Various embodiments of space charge wave amplifier in accordance with this invention are illustrated in FIGS. 3–6 which utilize a cathode drop, or localized high electric field, region within a semiconductor body to support a growing space charge wave. The particular manner in which a cathode drop region is produced within a semiconductor body can be understood by reference to FIGS. 1A and 1B, such figures being keyed. Also, FIG. 1B is keyed to each of FIGS. 2A, 2B, and 2C, the latter illustrating particular structures which can be employed to produce the cathode drop region.

Figures 2A, 2B, 2C:
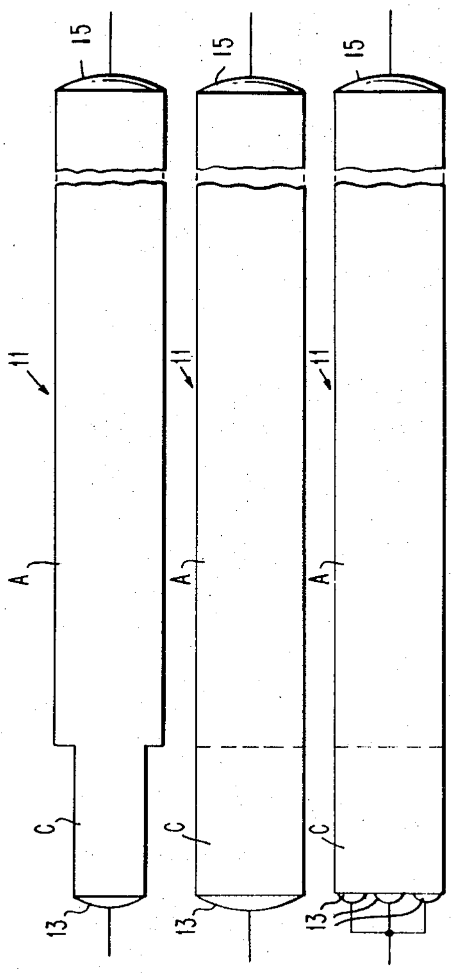
FIGS. 2A, 2B, and 2C illustrate various structures to effect the requisite $J/N$ ratios in different regions of a semi-conductor body.

Referring to FIGS. 2A, 2B, and 2C, respectively, a semiconductor body 11, for example, of n-type GaAs, is shown as having two distinct regions, i.e., cathode region C and active region A. For a given current passed through ohmic contacts 13 and 15, the relative ratios of current density J to ionized impurity density N are such as to produce a stationary high electric field region extending into region A which has the lower $J/N$ ratio. Referring particularly to FIG. 2A, cathode region C in semiconductor body 11 has a reduced cross-sectional area as compared to the cross-sectional area of active region A; while region C is illustrated adjacent cathode contact 13, such region can be located along an intermediate portion of semiconductor 11. For a given current passed through ohmic contacts 13 and 15, current density $J_C$ in cathode region C is greater than current density $J_A$ in active region A, the densities $N_C$ and $N_A$ of ionized impurities in regions C and A, respectively, are equal. Thus the condition $J_C/N_C>J_A/N_A$ is met.

In similar fashion, the critical ratio can be satisfied by fabricating cathode region C of higher-resistivity material than active region A as shown in FIG. 2B, such that the ionized donor density $N_C$ in cathode region C is less than the ionized donor density $N_A$ in active region A. For a given current passed through ohmic contacts 13 and 15, current densities $J_C$ and $J_A$ in regions I and II, respectively, of the semiconductor body are equal but the relationship $J_C/N_C>J_A/N_A$ is established.

Alternatively, as shown in FIG. 2C, cathode contact 13 can be subdivided into two or more independent portions, such portions being commoned to the current source. Since the total area of cathode contact 13 of FIG. 2C is less than the cross-sectional area of active region A, current density $J_C$ near the cathode contact and in cathode region C is greater than current density $J_A$ in active region A. Accordingly, the proper relationship, i.e. $J_C/N_C>J_A/N_A$ is achieved, since the ionized impurity density N in semiconductor body 11 is uniform.

Figure 1A:
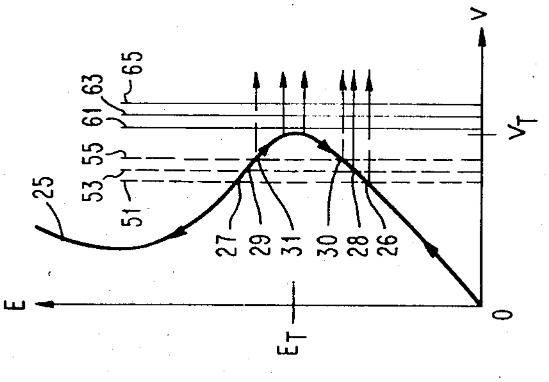

The purpose of relating the $J/N$ ratios of cathode region C and active region A of semiconductor body 11 is to produce a localized space charge region in cathode region C. This results when the current density exceeds the critical value $eNv_T$ in region C, but not in region A, $V_T$ being their maximum drift velocity, as shown in FIG. 1A. Thus, the current can be carried, without significant space charge by the carriers liberated by the ionized impurities in region A, but in region C, additional carriers injected from the contact are required to carry the current and a strong space charge results. The length of cathode region C is determined such that, for a given current passed through contacts 13 and 15, enough space charge is developed in such region that the electric field intensity $E_0$ at the boundary $x_0$, as shown in FIG. 1B, is greater than the threshold intensity $E_T$, i.e., $E_0$ is high enough that the charge carriers exhibit a negative differential mobility. The establishment of such space charge, through a proper choice of the relative $J/N$ ratio of active region A, creates a cathode drop region which extends into active region A for a distance determined by the magnitude of the applied current.

To understand the mechanism for producing a cathode drop region in active region A, reference is made to FIG. 1A. As the intensity of the electric field E in semiconductor body 11 is increased from zero, the velocity $v$ of charge carriers increases from zero to a maximum velocity $v_T$ at threshold intensity $E_T$. With further increase of electric field intensity, the charge carriers begin to exhibit a negative differential mobility, and their velocity decreases. In the case of some multivalleyed semiconductor materials such as GaAs, In P, CdTe, ZnSe, etc., such differential negative mobility arises due to the transfer of conduction carriers from a high-mobility to a low-mobility conduction band. The current density in the semiconductor is given by $J=\rho v(E)+Nev(E)$, where $\rho$ is the net space charge. In a one-dimentional case, as illustrated in FIG. 1B, the electric field distribution satisfies the equation:

$$\frac{K}{4\pi eN}\frac{dE}{dx}=\frac{J/eN-v(E)}{v(E)} \qquad (1)$$

as a function of the distance $x$ in the direction of carrier flow, together with the boundary condition $E=0$ when $x=0$. Thus, the electric field at any point in the semiconductor body, distant $x$ from the cathode contact 3, is given by:

$$\frac{4\pi eNx}{K}=\int_0^{E}\frac{v(E')dE'}{J/eN-v(E')}$$

This equation has singular solutions $E=E_n$=constant if there exist values $E_n$ of E for which $v(E_n)=J/eN$. If E has one of the values $E_n$ then it remains equal to $E_n$ as far as the ratio $J/eN$ remains constant. In a sense, the $E_n$ can be regarded as equilibrium values of the electric field E. However, the equilibrium may be stable, in which case a solution which starts from a point close to an equilibrium value $E_n$ approaches $E_n$ exponentially as the distance $x$ increases, or it may be unstable, in which case the solution diverges from $E_n$ (there is a mathematical, but not physical, correspondence to the existence of stable and unstable equilibria in mechanics). In the neighborhood of an equilibrium value $E_n$, Equation 1 can be written $$\frac{K}{4\pi eN}\frac{d(E-E_n)}{dx}=-\frac{1}{v(E_n)}\frac{d}{dE}(E-E_n) \qquad (2)$$

which has the solution $$(E-E_n)=C_{\exp}\left(-\frac{4\pi eN}{Kv(E_n)}\frac{dv}{dE}x\right)$$

where C is a constant.

The stability, or otherwise, of the solution $E=E_n$ is seen to depend on the sign of the expression $$\left(\frac{dv}{dE}\right)_{E_n}$$

a stable solution requires $dv/dE>0$.

The condition for stable equilibrium corresponds to an intersection of a particular line $Je/N$ and the curve $v(E)$ in a region of positive slope, and an unstable equilibrium corresponds to an intersection in a region of negative slope. If there is no intersection, there is no equilibrium value of field. In the last case, the field increases indefinitely with distance as a result of a net space charge. Physically, this arises because the velocity $v$ cannot become large enough to support the curent density $J$ with $n=N$; additional electrons are injected from the cathode, so that space charge is produced. The behavior of any solution of Equation 1 can be described with the aid of a diagram such as given in FIG. 1A. Solutions in the $v$(E) plane follow the curve 25, always tending to approach a point of stable equilibrium for example, such as point 26, and to move away from a point of unstable equilibrium, for example, such as point 27, as shown by the arrows on curve 25. The equilibrium points are determined by the intersections of curve 25 with lines, such as 51, corresponding to the appropriate value of $J/eN$, the points being stable or unstable accordingly as the slope of curve 25 is positive or negative at the intersection. It should be noted that whenever $v$(E) is less than $J/eN$ (even if there is no equilibrium point), the electric field intensity E increases as the distance $x$ increases.

For given values of $v$(E) and of $J/eN$, the solution for E($x$), i.e. the electric field intensity at a distance $x$ from the cathode contact can be obtained by integrating Equation 1 to obtain:

$$E=\frac{4\pi e}{K}\int_0^{x}\left[\frac{J(x')}{ev\{E(x')\}}-N(x')\right]dx'$$

In inhomogeneous structures such as shown in FIGS. 2A–2C, the appropriate variations of J and N must be substituted in Equation 4.

When both the lines corresponding to the values of $J/eN$ in regions C and A, respectively, intersect curve 25 of FIG. 1A in the positive mobility region no significant space charge is developed in either region. Under such conditions, the ionized impurity densities $N_C$ and $N_A$ of the regions C and A, respectively, are sufficient to support current flow. A space charge, however, is produced in cathode region C when the current density is increased, so that the ratio $J_C/eN_C$ exceeds the maximum value of $v$ and majority carries, or electrons, are injected into cathode region C from cathode contact 13.

The manner in which the space charge region formed in cathode region C is able to create a cathode drop in active region A of semiconductor body 11 can be understood by reference to FIGS. 1A and 1B. As the applied voltage is increased, the ratio $J_C/N_C$ and $J_A/N_A$ of regions C and A, respectively, are increased. Considering the static Equation 1 the electric field intensity increases with increasing distance $x$ while $J/eN$ is greater than $v$; the electric field intensity remains constant with increasing distance $x$ when $J/eN$ is equal to $v$; and the electric field intensity decreases with increasing distance $x$ while $J/eN$ is less than $v$. For magnitudes of applied current less than a threshold value given by $I_T=A_CN_Cev_T$, the density $N_C$ of ionized impurities in cathode region C is sufficient to support current flow in semiconductor body 11 without any significant net space charge. Under such conditions, the electric field intensities in cathode region C and active region A are below the threshold intensity $E_T$, the charge carriers exhibit a positive differential mobility, and the number of ionized impurities is sufficient in each region to support the current densities $J_C$ and $J_A$, respectively. When the current through semiconductor body 11 is increased to value $I_1$, such that the $J/eN$ ratio in cathode region C is just greater than the maximum value of $v$, as shown by the non-intersection of line 61, corresponding to the value of $J_C/eN_C$, with curve 25 of FIG. 1, space charge exists throughout cathode region C and conduction electrons are injected into cathode region C. from the cathode contact 13. Accordingly, the electric field intensity E increases with distance throughout cathode region C, as depicted by the electric field gradient in the cathode region of curve 1 of FIG. 1B. For the same current $I_1$, the ratio $J_A/eN_A$ in active region A is less than the maximum value of $v$, and so the ionized impurity density is sufficient to support current flow in region A without space charge. The electric field intensity $E_{A1}$ in active region A corresponding to this condition is indicated by the lower intersection 26 of the line 51, corresponding to $J_A/eN_A$, with curve 25 of FIG. 1A. It is noted that the electric field intensity $E_{01}$, at boundary $x_0$ of regions C and A, is less than the threshold intensity $E_T$ and all of the conduction carriers exhibit a positive mobility. The excess $E-E_n$ of the electric field E over the equilibrium value $E_n$ falls off rapidly with increasing distance $x$ from boundary $x_0$ according to Equation 1.

When the current through semiconductor body 11 is increased to a value $I_2$, conduction conditions in regions C and A are represented by lines 63 and 53. The increased space charge in region A allows the field to reach a value $E_{02}>E_T$ at the boundary $x_0$. Thus even though there exists a stable equilibrium value $E_{A2}$ for the field in region A, the solution starts out at the boundary from a point in the negative differential-mobility region of curve 25. However, as this point is not close to the corresponding unstable point 29, the field moves rapidly towards its stable equilibrium point 28. Thus, the part of region A where exceeds $E_T$ is confined to the immediate neighborhood of the boundary $x_0$. Consequently, the conduction carriers in a portion of active region A adjacent boundary $x_0$ now exhibit a negative differential mobility.

As the current through semiconductor body 11 is further increased to a value $I_3$, a more intense negative space charge region is produced in cathode region C due to injection of majority carriers from cathode contact 13, as denoted by the non-intersection of line 65 with curve 25 of FIG. 1A. Consequently, the electric field intensity at boundary $x_0$ is increased further above the threshold intensity $E_T$ to a value $E_{03}$. At the same time, the field $E_{03}$ corresponding to the unstable equilibrium point 31 in region A is decreased, because of the negative slope of the curve 25 in the region of unstable equilibrium. For example, consider that, as a result of the decrease of $E_n$, and the increase of $E_0$, current $I_3$ through semiconductor body 11 is such as to establish an electric field intensity $E_{03}$ at boundary $x_0$ which is very close to the unstable equilibrium value $E_{n3}$ determined by intersection 31 of line 55 with curve 25 of FIG. 1A.

Near an unstable equilibrium point, the value of $E-E_n$ varies approximately exponentially as a function of distance $x$, as given by Equation 3, until a turning point such as $E_T$ is passed. Consequently, since $(E_{n3}-E_{03})$ is small, a substantial distance along active region A is required for the electric field intensity to diverge significantly from $E_{03}$. Hence the field remains approximately constant, as shown by the cathode drop region 41 of curve 3 of FIG. 1B, along a substantial portion of active region A. However, the electric field intensity eventually approaches an intensity $E_{A3}$ defined by the intersection 30 of line 55 with the positive-slope portion of curve 25. Once the situation is achieved that the electric field intensity at boundary $x_o$ approaches an unstable equilibrium value $E_n$, a very small increase in current will substantially increase the length of the cathode drop region 31 over which the electric field intensity remains substantially constant. Thus, in cathode drop region 41, the voltage, i.e., the area under the curve 3, increases rapidly with increasing current and the current-voltage curve for the semiconductor body 11 becomes almost flat. Consequently, the length of cathode drop region 41 can be conveniently controlled by the magnitude of voltage applied across semiconductor body 11. Therefore, it is an inherent consequence of the way in which cathode drop region 41 is formed that conduction carriers exhibit a differential negative mobility within such region. Thus, the described mechanism provides a convenient way of producing a region of controlled length wherein conduction carriers exhibit a differential negative mobility.

Various embodiments, have been shown in 2A–2C which are not exclusive, for establishing the proper $J/N$ ratios within a seimconductor body so as to produce a cathode drop region. For example, the cathode region can be defined by a region of reduced cross-sectional area within a uniformly doped semiconductor body as shown in FIG. 2A, a region of higher reisitivity within a semiconductor body of uniform cross-sectional area as shown in FIG. 2B, or by providing a segmented cathode contact having a total contact area less than the cross-sectional area than the semiconductor body as shown in FIG. 2C thereby constricting current flow so as to provide a region of increased current density near the cathode contact.

When a cathode drop region, for example, as indicated by 41 of FIG. 1B, has been formed, a growing space charge wave can be supported if the electric field within such region is perturbed, for example, by exciting an RF electric field component in the direction of current flow. Such perturbation propagates in the direction of carrier flow, .i.e, toward a anode contact 15. and its amplitude increases exponentially as a function of the propagation distance as long as the change carriers exhibit a differential negative mobility. Accordingly, the growth in amplitude of a space charge wave can be conveniently controlled by varying the voltage applied across semiconductor body 1 in FIGS. 2A–2C so as to control the length of the cathode drop region 41. Since the electric field intensity at a point in the cathode drop region 41 will vary in time due to the traveling space charge wave, an amplified output signal can be sensed, for example, by connecting output circuitry across a portion of the cathode drop region equal to one-half of the wavelength of the traveling space charge wave. The wavelength is equal to the charge carrier velocity $v$ divided by the frequency of the signal. Alternatively, the output circuitry may be connected across semiconductor body 11 as a whole.

For example, in FIGS. 3 through 6, the amplification of a sinusoidal signal supplied from source S is described, the dashed lines indicating successive phase fronts of the traveling space charge wave. In such embodiments, the cathode drop region, or high electric field region, wherein conduction carriers exhibit a negative differential mobility, is assumed to extend along the entire length of the semiconductor body.

Figure 3:
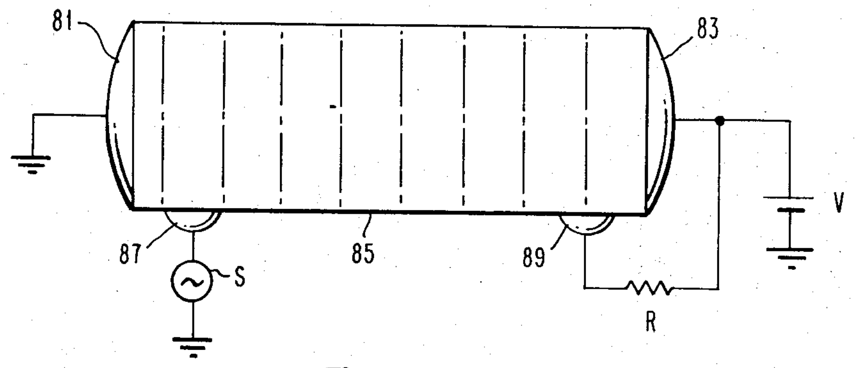
FIGS. 3–6 illustrate the structures of various space charge wave amplifiers in accordance with the present invention.

In FIG. 3 cathode and anode contacts 81 and 83, for example, as described in FIG. 2B, are provided to semiconductor body 85. A voltage source V is connected across contacts 81 and 83 so as to achieve a cathode drop region which extends the length of body 85. The cathode region, described as region C in FIGS. 2A–2C, has not been shown since it is of minimal length. Cathode contact 81 is connected to ground and anode contact 83 is connected to voltage source V. Signal source S is ohmically connected to semiconductor body 85 at input contact 87. Also, load R is connected across anode contact 83 and output contact 89, the spacing between anode contact 83 and output contact 89, for example, being equal to approximately one-half of the wavelength of the traveling space charge wave. Accordingly, load R is connected between points in the space charge wave between which the potential excursions are approximately maximized, to optimize energy transfer to load R. While it is preferred that the load R be coupled to the traveling space charge wave signal across a portion of the space charge region adjacent anode contact 83, such coupling can be achieved across any intermediate portion of body 85.

Signal source S disturbs the electric field distribution between cathode contact 81 and input contact 87 in regular time-varying fashion whereby a sinusoidal perturbation is superimposed on the cathode drop region at the cathode end of body 85. As a result, a space charge wave is produced and propagates in the direction of current flow along body 85 and toward the anode contact 83, the dashed lines indicating equal phase fronts of the traveling space charge wave. As the space charge wave travels past output contact 89, the potential at contact 89 varies in periodic fashion with respect to the potential at anode contact 83, the magnitude of such potential variation being dependent upon the spacing therebetween. As hereinabove described, the space charge wave grows exponentially as it travels along the cathode drop region whereby the energy of the wave is amplified and delivered to load R.

Figure 4:
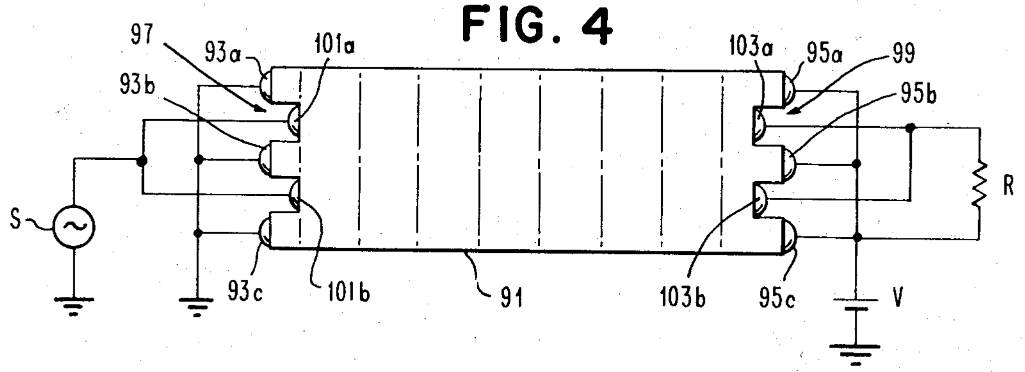
Figure 5:
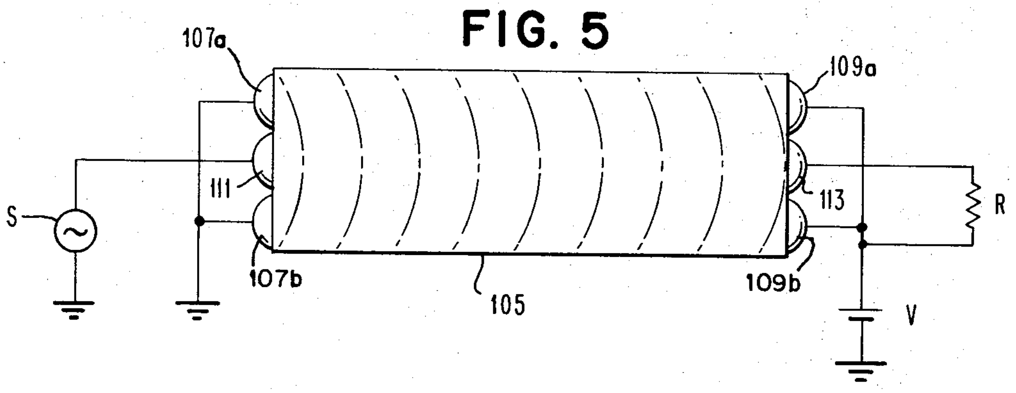
Figure 6:
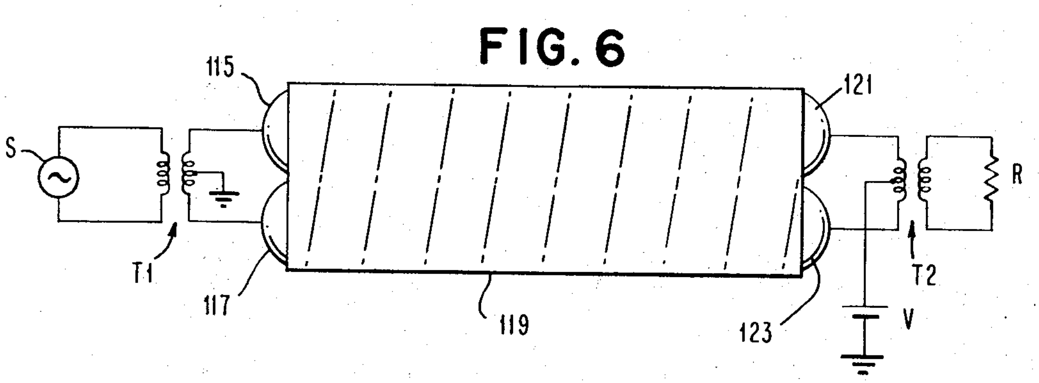

In FIGS. 4–6, the amplification is effected in a similar fashion. For example, in FIG. 4, the cathode and anode ends of semiconductor body 91 are preformed to define recesses 97 and 99. Recesses 97 and 99 can be defined as either holes or grooves, either parallel or circular. The cathode contact is defined by segments 93*a*, 93*b*, and 93*c* and, in similar fashion, the anode contact is defined by segments 95*a*, 95*b*, and 95*c* on the original surfaces of body 91. Preferably, the depths of recesses 97 and 99 are equal to one half of the wavelength of the signal suplied by source S. Source S is connected to an input contact defined by segments 101*a* and 101*b* formed on the bottom surfaces of recess 97; the output contact is defined by segments 103*a* and 103*b* formed on the bottom surfaces of recess 99. The structure of FIG. 4 corresponds essentially to the showing of FIG. 2A wherein the effective cross-sectional area of the cathode region reduced with respect to the cross-sectional area of the active region of the semiconductor body. Source S is connected across cathode segments 93*a*, 93*b*, and 93*c* and input contact segments 101*a* and 101*b* to periodically disturb the electric field distribution within semiconductor body 91 to produce a traveling space charge wave. Again, this traveling space charge wave grows exponentially along body 91 to periodically vary the potential between anode contact segments 95*a*, 95*b*, and 95*c* and output contact segments 103*a* and 103*b* whereby the signal supported by source S is amplified and delivered to load R.

In FIG. 5, contacts are formed on semiconductor body 105 either as parallel stripes, or in "dot-ring" fashion, such that the traveling space charge wave has curved phase fronts. For example, cathode contact is defined by parallel stripes 107*a* and 107*b* and the anode contact is defined by parallel stripes 109*a* and 109*b* on body 105; input contact 111 and output contact 113 are formed as single stripes between the component stripes of the cathode and anode contact structures, respectively. Source S connected to input contact 111 is effective to vary periodically the potential of stripe 111 with respect to cathode stripes 107*a* and 107*b*. The space charge wave, thus produced, has a curved phase front, as indicated by the dashed lines, as it travels along body 105 toward the anode contact. Since anode stripe 109*a* and 109*b* and output contact 113 are formed on different regions of the end base of body 105, and since the phase fronts of the wave are curved, the contacts couple to portions of the traveling space charge wave having different phases. Accordingly, the potential between anode stripes 109*a* and 109*b* and output stripe 113 varies periodically in time whereby amplified signal is delivered to load R.

In the embodiment shown in FIG. 6, signal source S is transformer-coupled to the cathode contact which is segmented so as to function as both input and cathode contacts. The two halves act together as the cathode contact, but the signal is applied differentially between them. Source S is connected across the primary winding of transformer T1 having a secondary winding with grounded center tap terminal, and end terminals which are connected to segmented ohmic contacts 115 and 117 to semiconductor body 119. Accordingly, the alternating current signal supplied from source S applied voltages of opposite polarity to contacts 115 and 117 periodically in turn. Also, segmented ohmic contacts 121 and 123 to semiconductor body 119 function as both output and anode contacts. Since the secondary winding of transformer T1 is center-tapped and contacts 115 and 117 are arranged in a same plane, space charge waves are produced, having phase fronts inclined to the direction of current flow. As they travel along the semiconductor body 119, the inclination of the phase fronts is maintained, as indicated by the dashed lines. Since the output-anode contacts 121 and 123 are arranged in a same plane, the tilted space charge waves traveling along semiconductor body 119 cause the potential between the output-anode contacts 121 and 123 to periodically vary in time. Output-anode contacts 121 and 123 are connected to the primary winding of transformer T2, such primary winding being center-tapped and connected to voltage source V. Load R is connected across the secondary winding of transformer T2, the variation of potential between output-anode contacts 121 and 123 being effective to energize the secondary winding and produce an amplified signal in load R.

While the invention has been particularly shown and described with reference to preferred embodiments thereof, it will be understood by those skilled in the art that various changes in form and details may be made therein without departing from the spirit and scope of the invention.

What is claimed is:

1. A space charge wave amplifier comprising:

a body of semiconductor material having a multivalley energy band system including a low mobility band and a high mobility band, conduction carriers being transferrable from said high mobility band to said low mobility band under the influence of electric fields to produce a negative differential mobility for electric fields in excess of a threshold intensity $E_T$, one region of said body when current is flowing along the body having a lower $J/N$ ratio than that of an adjoining region of said body, where J is current density and N is ionized impurity density, means connected to said body for supporting current flow along said body and for establishing electric fields at least of said threshold intensity $E_T$ at the boundary between said one region and said adjoining region, the difference in $J/N$ ratios being such that the current density exceeds a critical value in said adjoining region but not in said one region to inhibit the formation of travelling domains and to produce a stationary high electric field region extending into said one region having a lower $J/N$ ratio, the electric field intensity within said stationary region being in excess of said threshold intensity whereby said conduction carriers exhibit a negative differential mobility, said critical value of current density being equal to ($eNV_T$), where $e$ is the electric charge on a carrier, N is the ionized impurity density in the region, and $V_T$ is the maximum carrier drift velocity, means for producing a travelling space charge wave along said stationary region, and load means coupled to said body and responsive to said traveling space charge wave.

2. A space charge wave amplifier as defined in claim 1 wherein said adjoining region has a smaller cross-sectional area than that of said one region.

3. A space charge wave amplifier as defined in claim 1 wherein said adjoining region is formed of higher resistivity material than said one region.

4. A space charge wave amplifier as defined in claim 1 further including ohmic means for connecting said supporting and establishing means to said body, at least one of said ohmic means having a contact area to said body which is less than the cross-sectional area of said body in the direction of current flows.

5. A space charge wave amplifier comprising:

a body of semiconductor material of single conductivity type and having at least first and second distinct regions having different $J/N$ ratios when current is flowing along the body, where J is current density and N is ionized impurity density, means connected to said body for supporting current flow along said regions, said current flow being of sufficient magnitude and the difference in $J/N$ ratios being such that the current density exceeds a critical value in said first region but not in said second region to inhibit the formation of travelling domains and to produce a stationary high electric field region along said second region exhibiting the lesser $J/N$ ratio, electric fields within said stationary region being substantially uniform and of sufficient intensity to cause conduction carriers to exhibit a negative differential mobility, said critical value of current density being equal to ($eNV_T$), where $e$ is the electric charge on a carrier, N is the ionized impurity density in the region, and $V_T$ is the maximum carrier drift velocity, means for perturbing said electric fields within said stationary region to produce a traveling space wave, and load means coupled to said body and responsive to said traveling space charge wave.

6. A space charge wave amplifier comprising:

a body of semiconductor material of single conductivity type having a multivalleyed energy band system including a low mobility band and a high mobility band, conduction carriers being transferrable from said high mobility band to said low mobility band under the influence of electric fields in excess of a threshold intensity $E_T$, one region of said body when current is flowing along the body having a $J/N$ ratio lower than that of an adjoining region of said body to define a boundary therebetween, where J is current density and N is ionized impurity density, means connected across said body to support current flow along said body, said means being sufficient to establish an electric field of first intensity at said boundary sufficiently in excess of $E_T$, and the difference in $J/N$ ratios being such that the current density exceeds a critical value in said adjoining region but not in said one region to inhibit the formation of travelling domains and to produce a stationary high electric field region extending into said one region, the electric field within said stationary region being substantially uniform and substantially equal to said first intensity, said critical value of current density being equal to ($eNV_T$), where $e$ is the electric charge on a carrier, N is the ionized impurity density in the region, and $V_T$ is the maximum carrier drift velocity, means for periodically perturbing said electric fields within said space charge region so as to produce a traveling space charge wave along said stationary region and, load means connected to said semiconductor body and responsive to said travelling space charge wave.

7. A space charge wave amplifier as defined in claim 6 wherein said connected means are variable so as to control the extension of said stationary region into said adjoining region.

8. A space charge wave amplifier as defined in claim 6 wherein said semiconductor material is selected from the group consisting of GaAs, InP, CdTe, and ZnSe.

9. A space charge wave amplifier comprising:

a body of semiconductor material having multivalley energy band system including a low mobility band and a high mobility band, conduction carriers being transferred from said high mobility band to said low mobility band under the influence of electric fields in excess of a threshold intensity $E_T$, said body including adjoining first and second regions defining a boundary therebetween and having different $J/N$ ratios when current is flowing along the body, where J is current density and N is ionized impurity density, means for supporting current flow along said body and for establishing an electric field of sufficient intensity at said boundary between said adjoining regions in excess of said threshold intensity $E_T$, and the difference in $J/N$ ratios being such that the current density exceeds a critical value in said first region but not in said second region to inhibit the formation of travelling domains and to impart a negative differential mobility to carriers in at least a part of said second region having the lower $J/N$ ratio, said carriers having a velocity approaching that necessary to support said current density J in said second region having the lower $J/N$ ratio without space charge so as to produce a stationary high electric field region having substantially uniform intensity extending into said second region having the lower $J/N$ ratio, said critical value of current density being equal to ($eNV_T$), where $e$ is the electric charge on a carrier, N is the ionized impurity density in the region, and $V_T$ is the maximum carrier drift velocity, means for perturbing said electric field within said stationary region so as to produce a travelling space charge wave, and load means coupled to said body and responsive to said traveling space charge wave.

10. A space charge wave amplifier as defined in claim 9 wherein said body is formed of n-type semiconductor material.

11. A space charge wave amplifier as defined in claim 9 wherein said region having the larger $J/N$ ratio is defined by a portion of said body having a reduced cross-sectional area.

12. A space charge wave amplifier as defined in claim 9 wherein said region having the lower $J/N$ ratio is defined by a portion of said body having a reduced impurity density.

13. A space charge wave amplifier as defined in claim 9 further including ohmic contact means for connecting said supporting and establishing means to one substantially planar surface of said body, the area of said ohmic means being less than the cross-sectional area of said semiconductor body in the direction of current flow.

14. A space charge wave amplifier as defined in claim 9 wherein one surface of said body is preformed to define at least one recess, said supporting and establishing means being connected at said one surface and said perturbing means being connected within said one recess.

15. A space charge wave amplifier as defined in claim 9 wherein said supporting and establishing means and said perturbing means are each connected by ohmic contacts to a same substantially planar surface of said body, one of said ohmic contacts having an annular geometry.

16. A space charge wave amplifier as defined in claim 9 wherein said perturbing means includes an alternating current source and further including means for exciting at least two contacts to said body in different phases.

17. A space charge wave amplifier as defined in claim 9 including means for connecting said perturbing means to said body to produce a traveling space charge wave having a curved phase front.

18. A space charge wave amplifier as defined in claim 9 including means for connecting said perturbing means to said body to produce a traveling space charge wave having a phase front which is inclined with respect to the direction of current flow along said body.

References Cited

FOREIGN PATENTS 1,497,937 9/1967 France.

OTHER REFERENCES

Proceedings of IEEE, "Bulk Semiconductor High-Speed Current Generator," by Shoji, May 1967, pp. 720–721.

IEEE Trans. on Elec. Devices, "Gunn Oscillator With One Electrode Split," by Nordbotten, September 1967, page 608.

JERRY D. GRAIG, Primary Examiner

U.S. Cl. X.R.

331—107